(12) United States Patent
Daiber et al.

(10) Patent No.: US 6,724,790 B1
(45) Date of Patent: Apr. 20, 2004

(54) LASER FACET PHASE CONTROL

(75) Inventors: Andrew Daiber, Redwood City, CA (US); Jiann-Chang Lo, Cupertino, CA (US); Paul Chi-Hwa Lin, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 74 days.

(21) Appl. No.: 10/335,775

(22) Filed: Dec. 31, 2002

(51) Int. Cl.[7] ................................................. H01S 3/04
(52) U.S. Cl. ...................... 372/34; 372/20; 372/290.23; 372/32; 372/107; 372/108
(58) Field of Search ............................. 372/20, 34, 29, 372/23, 107, 108, 92, 36, 32, 98

(56) References Cited

U.S. PATENT DOCUMENTS

| | | | | |
|---|---|---|---|---|
| 5,337,328 A | * | 8/1994 | Lang et al. | 372/45 |
| 6,154,471 A | * | 11/2000 | Jin et al. | 372/20 |
| 2002/0176473 A1 | * | 11/2002 | Mooradian | 372/92 |
| 2003/0007540 A1 | * | 1/2003 | Daiber | 372/92 |
| 2003/0012237 A1 | * | 1/2003 | Tuganov et al. | 372/34 |
| 2003/0112835 A1 | * | 6/2003 | Williams et al. | 372/6 |
| 2003/0139003 A1 | * | 7/2003 | Gole et al. | 438/200 |

* cited by examiner

*Primary Examiner*—Leon Scott, Jr.
(74) *Attorney, Agent, or Firm*—Blakely, Sokoloff, Taylor & Zafman LLP

(57) ABSTRACT

A tunable external cavity laser apparatus and method of laser operation. The apparatus includes a gain medium having first and second facets defining a facet laser cavity in which a first portion of light is internally reflected to produce a first lasing condition having a first reflection phase. A reflective element is positioned opposite the second facet of the gain medium, forming an external laser cavity defined by the first facet and reflective element. A second portion of light is internally reflected within the external cavity to produce a second lasing condition having a second reflection phase. A phase adjustment means is employed to adjust the first reflection phase relative to the second reflection phase so as to control a characteristic of the output beam emitted from the apparatus, such as the power output level of the beam. In one aspect, the relative phase is adjusted by controlling the temperature of the gain medium.

30 Claims, 13 Drawing Sheets

Fig. 1 *(Prior Art)*

LASER FACET PHASE CONTROL

FIELD OF THE INVENTION

The field of invention relates generally to optical communication systems and, more specifically but not exclusively relates to enhanced tunable lasers and methods for providing enhanced output beam quality in such tunable lasers.

BACKGROUND INFORMATION

There is an increasing demand for tunable lasers for test and measurement uses, wavelength characterization of optical components, fiberoptic networks and other applications. In dense wavelength division multiplexing (DWDM) fiberoptic systems, multiple separate data streams propagate concurrently in a single optical fiber, with each data stream created by the modulated output of a laser at a specific channel frequency or wavelength. Presently, channel separations of approximately 0.4 nanometers in wavelength, or about 50 GHz are achievable, which allows up to 128 channels to be carried by a single fiber within the bandwidth range of currently available fibers and fiber amplifiers. Greater bandwidth requirements will likely result in smaller channel separation in the future.

DWDM systems have largely been based on distributed feedback (DFB) lasers operating with a reference etalon associated in a feedback control loop, with the reference etalon defining the ITU wavelength grid. Statistical variation associated with the manufacture of individual DFB lasers results in a distribution of channel center wavelengths across the wavelength grid, and thus individual DFB transmitters are usable only for a single channel or a small number of adjacent channels.

Continuously tunable external cavity lasers have been developed to overcome the limitations of individual DFB devices. Various laser tuning mechanisms have been developed to provide external cavity wavelength selection, such as mechanically tuned gratings used in transmission and reflection. External cavity lasers must be able to provide a stable, single mode output at selectable wavelengths while effectively suppress lasing associated with external cavity modes that are within the gain bandwidth of the cavity. These goals have been difficult to achieve, and there is accordingly a need for an external cavity laser that provides stable, single mode operation at selectable wavelengths.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIGS. 9A and 9B are schematic diagrams illustrating respective calibration systems used for generating a temperature vs. channel lookup table and/or a corresponding polynomial function, each of which may be employed to determine a target temperature for the gain medium corresponding to a selected input channel, wherein FIG. 9A illustrates a configuration in which the laser output beam power level is measured, and FIG. 9B illustrates a configuration employing a beam splitter in which a the power level of a portion of the laser output beam split off by the beam splitter is measured;

FIGS. 11A and 11B are block schematic diagrams of a Tau/dither servo control loop, wherein FIG. 11A depicts the control loop when used during an Acquire mode, and FIG. 11B depicts the control loop when used during a Tracking mode.

DETAILED DESCRIPTION OF PREFERRED EMBODIMENTS

Embodiments of method and laser apparatus that provided enhanced laser performance are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
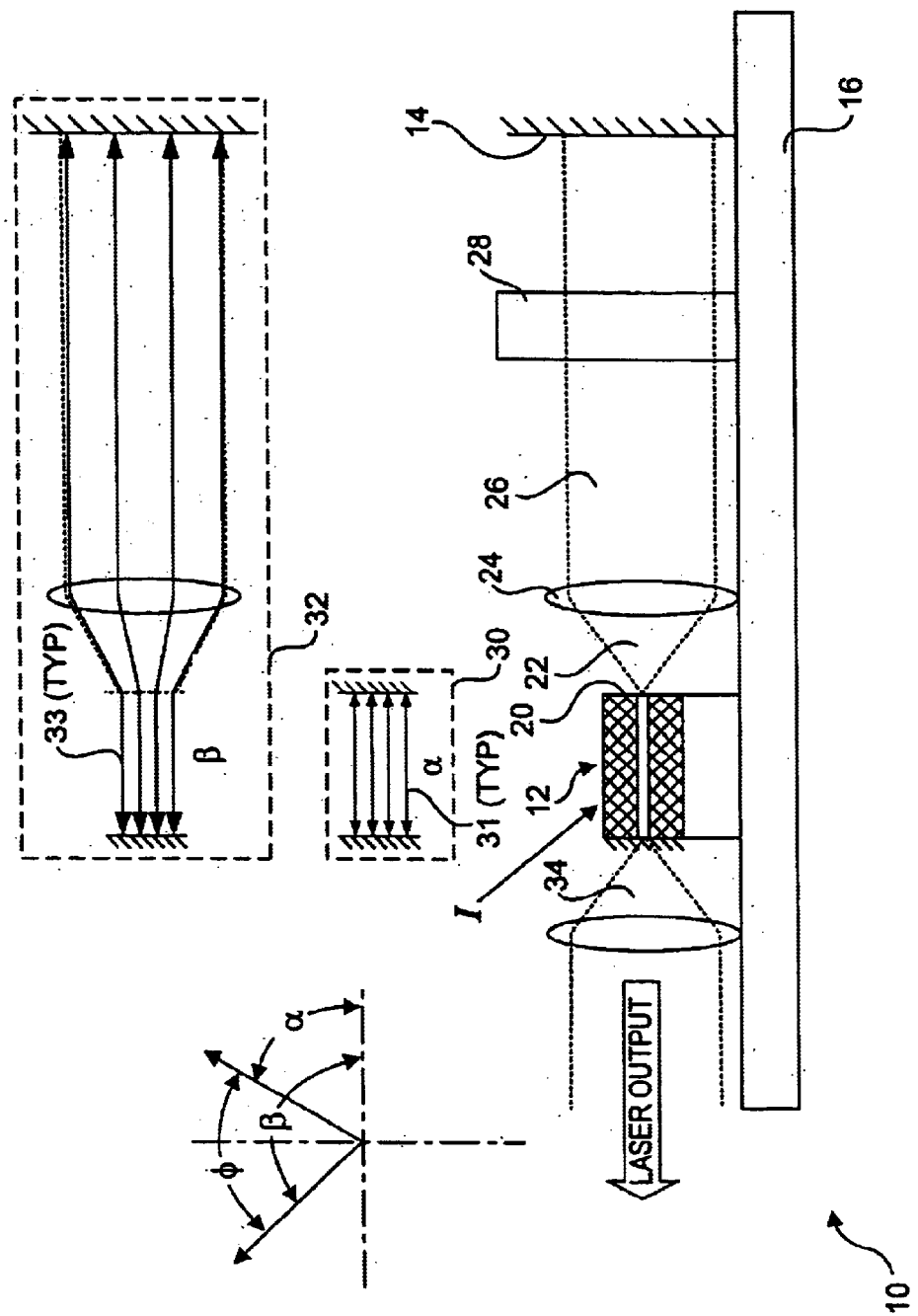
FIG. 1 is a schematic diagram of a conventional external cavity laser illustrating the problem created by the phase reflectance difference between lasing concurrent lasing modes in the laser facet cavity and the external laser cavity.

To illustrate the laser facet phase interference problem solved by embodiments of the present invention discussed below, a conventional external cavity laser (ECL) apparatus 10 is shown in FIG. 1. ECL apparatus 10 includes a gain medium 12 and a reflective element 14 coupled to a base 16. Typically, gain medium 12 may comprise a Fabry-Perot diode laser, as is well known in the art, which includes a "normal" partially-reflective facet 18 and an anti-reflection (AR)-coated facet 20. Reflective element 14 may generally comprise a mirror, grating, prism, or other reflector or retroreflector. Gain media 12 emits a light beam 22 from AR-coated facet 20 that is collimated by a lens 24 to define an optical path 26. Light beam 22 is reflected from reflective element 14 and returned along optical path 26, whereupon it again passes through lens 24, which focuses the light beam such that it is returned to gain medium 12. Wavelength selection components generally depicted at 28 are positioned in path 24 to feed back light to gain medium 12 at a selected wavelength. In some embodiments, reflective element 14 may be curved such that lens 24 may be omitted (not shown). Optionally, a toric lens system or other optical element(s) capable of re-imaging the returning light beam 22 onto facet 20 such that gain medium 12 receives feedback from the external cavity may be used in place of lens 22 (not shown).

In a conventional monolithic diode laser, such as that which may be employed for gain medium 12, the "laser cavity" is typically defined by the cleaved facets of the gain medium, i.e., facets 18 and 20. For clarity, this will be called the "F-P laser" cavity hereinafter, an example of which is graphically depicted as an F-P laser cavity 30. Typically, both facets of a conventional Fabry-Perot diode laser will comprise partially-reflective elements that operate as a pair of parallel mirrors placed opposite one other, causing the laser cavity to operate as a Fabry-Perot resonator, thereby enabling lasing to occur. However, in ECL apparatus 10 it is desired to minimize the light that is internally reflected from facet 20, thus the use of the AR-coating for such purposes. The end result is that the "effective laser cavity" 32 spans between gain media facet 18 and reflective element 14. The cavity between AR-coated facet 20 and reflective element 14 is termed the "external laser cavity."

In practice, it is not possible to achieve zero reflection at the AR-coated facet. As a result, a small fraction of the light produced by providing a current I to gain medium 12 is reflected from AR-coated facet 20, causing the portion of light to resonate within F-P laser cavity 30, as illustrated by light rays 31. At the same time, the vast majority of the light produced by gain medium 12 is reflected between partially reflective facet 18 and reflective element 14, causing the portion of light to resonate within effective laser cavity 32, as depicted by light rays 33. Furthermore, each set of light rays 31 and 33 are coherent. The end result of these light behaviors is that the light beam 34 exiting partially-reflective facet 18 will comprise a superimposed combination of a small portion of light rays 31 and a much large portion of light rays 33.

When the facet reflectivity of AR-coated facet 20 (the laser facet frequency $R_{facet}$) is small (e.g., $10^{-5}$ to $10^{-3}$) relative to the reflectivity of the external laser cavity optics $R_{ext}$ (e.g., $10^{-2}$ to 1) over a particular frequency range, the facet reflectivity may be considered as a perturbation imposed upon the reflectivity verses frequency of the external cavity in that frequency range, and this perturbation is the interference between the light reflected off the facet (i.e., light rays 31) and the light reflected-back from the external cavity optics (i.e., light rays 33). Alternately, a regime may be considered where the laser facet reflectivity is large relative to the reflectivity of the external cavity optics. In this case, the effective laser cavity is defined by the laser facets, and the external laser cavity is treated as a perturbation on this laser cavity. Finally, the general regime may be considered where neither the facet reflectivity nor the external cavity reflectivity is assumed to be small relative to the other. In this case, neither the cavity length defined by the laser facet nor the cavity length defined by the end mirror is treated as dominating the laser behavior. The laser behaves as if it consists of two interfering cavities and assumes characteristics of both cavities.

In all regimes described above, the light reflected from the laser facet interferes with the light reflected by the external cavity. Interference, as used here, refers to the well-known process of how two individual coherent light beams must be summed to determine the resultant optical field. This summation depends on the relative amplitudes of the two beams and also the relative phase of the two beams. In accordance with aspects of the invention, apparatus and methods are disclosed below by which the relative phase of the reflection of these two beams are controlled to improve the quality of beam 34, not only for a single frequency, but over multiple frequencies. This reflection control may be employed to maximize laser output power, improve side-mode suppression, stabilize the laser relative to external perturbations, tune the laser, and many other laser characteristics, depending on the particular design of the laser apparatus.

As an illustrative example, in an exemplary embodiment of laser apparatus 10, the reflectively $R_{ext}$ comprising feedback from the external cavity at the wavelength of lasing is made as high as possible, typically about 0.4 or 40%. Increasing the feedback is desirable because it increases the laser power and increases the laser power relative to the amplified spontaneous emission background. At the same time, the laser facet reflectivity $R_{facet}$ is specified to be below $10^{-4}$ across the tunable range of the laser. In practice, this level of reflectivity is difficult to achieve, and the yield of coatings meeting this specification may be low.

The interference between the external cavity reflection and the laser facet reflection are now considered. For illustrative purposes, consider that light rays 31 have a phase angle of α due to the laser facet reflection, and that light beam 33 have a phase angle of β due to the external cavity reflection. When the light reflected by the laser facet is in phase with the light reflected by the external cavity (that is α=β), the amplitudes of the reflection add together and the resulting reflectivity is higher than the external cavity reflection considered alone. When the light reflected by the relative cavities are out of phase, the amplitudes of the reflections subtract and the resultant reflectivity is lower than the external cavity reflection considered alone. In general, the resultant reflectivity R is related to the external cavity reflection $R_{ext}$ and the laser facet reflection $R_{facet}$ by:

$$R = |R_{ext}^{0.5} + R_{facet}^{0.5} * (\cos\phi + I\sin\phi)|^2 \qquad (1)$$

Wherein φ is the relative phase between the two reflections and $I=(-1)^{0.5}$. With the typical numbers above ($R_{ext}$=0.4, $R_{facet}$=$10^{-4}$), we get R=0.413 when the reflections are in phase (φ=0) and R=0.387 when the are completely out of phase (φ=πradians or 180°). Therefore, when the light beams are in-phase the reflectivity is 7% higher than when the light beams are out of phase. It is noted that although the intensity of reflectivity $R_{facet}$ ($10^{-4}$) is several orders of magnitude less than that for $R_{ext}$ (0.4), the resultant modulation is 7% because the light beams are added in amplitude and not in intensity.

Figure 2:
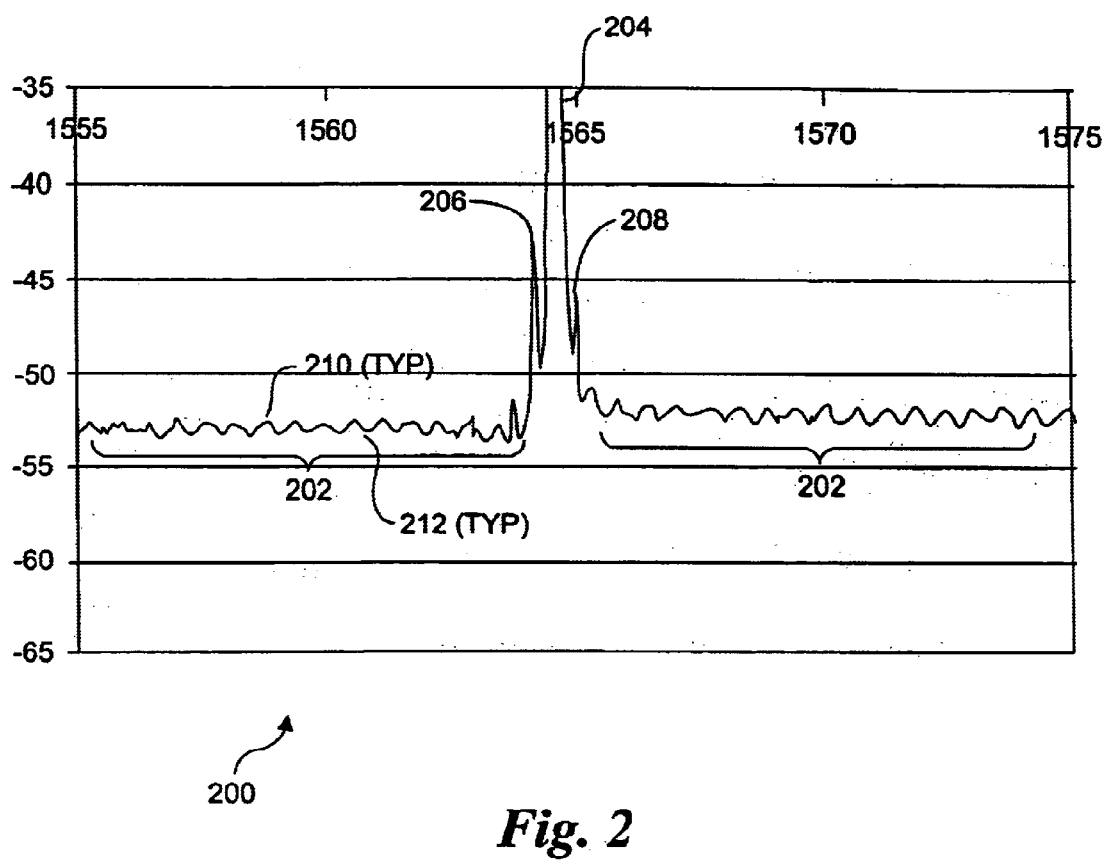
FIG. 2 is a graph of a laser frequency response illustrating a lasing mode, side modes, and crests and troughs of a baseline mode.

If the reflection of the external cavity is in phase at a given wavelength, it will generally not be in-phase at other wavelengths. For example, FIG. 2 shows a graph 200 of the spectrum of an operating external cavity laser. The modulation of the baseline 202 is caused by the interference of light reflected by the laser facet and light reflected by the external cavity. This interference goes in and out of phase as the wavelength is changed.

Also visible in the figure are the lasing mode 204 (which travels off the graph) and the side modes 206 and 208. The side modes are the small peaks adjacent to the lasing mode. Generally, the lasing mode is selected by a "tuning filter" (depicted as wavelength selector 28) that is disposed in the external cavity and provides a higher transmission at the wavelength of the lasing mode than the wavelengths of other modes. Typically, the filter provides at least 12% more reflection at the lasing mode than at all other modes. The filtering is approximately 12% at the side modes and greater than 12% at other modes that are not visible in the laser spectrum. The laser gain process is extremely nonlinear, and the 12% reduction in feedback gets amplified to −55 dB by the lasing action.

It is noted that the 12% filtering used by the tuning filter to suppress adjacent modes is comparable to the 7% modulation produced by the laser facet reflectivity. If the laser facet reflectivity specification was increased to 4*10−4, then the modulation would be 13% and this modulation would be greater than the filtering used to tune the laser. The laser facet reflection can and does make a large contribution to the overall filtering present in the laser cavity. The laser facet reflectivity can affect all aspects of laser performance determined by cavity filtering. These effects include tuning characteristics of the laser, as well as power, side mode suppression, spontaneous emission, etc.

The effects of the laser phase can be described with further consideration of the spectrum show in FIG. 2. The baseline oscillation 202 is obscured near the lasing mode because the instrument being used for this measurement has insufficient response. Nonetheless, the oscillations can be extrapolated through the laser mode region and one can discuss whether the laser falls on a "crest" 210 of the baseline oscillation or a "trough" 212. The crests correspond to where the laser facet reflection is in phase with the external feedback and the troughs correspond to where these are out of phase.

Mechanisms are discussed below that enable the oscillation to be translated relative to the lasing frequency. When the "knob" is turned, the oscillation "wave" will translate in frequency and the laser mode can be thought of a floating on top of the wave. As the wave travels past the lasing mode, the lasing mode will travel up the wave, over the crest, down the wave, into a trough, up to the next crest, etc.

When the lasing mode is on a crest, the lasing power will be greater than when the lasing mode is in a trough. Physically, this occurs because there is more feedback into the gain medium when the laser facet reflection is in phase with the external cavity feedback (the wave crest) and less feedback into the gain medium when they are out of phase (the wave trough).

The phase of the reflection also affects the side mode suppression of the laser and the tuning behavior. To understand these effects, consider how the "wave" impacts the adjacent side modes. Typically, these will be the next modes to lase if the total intracavity filtering, which is selecting the lasing mode, is perturbed. Since the total intracavity filtering includes the filtering caused by interference effects between the reflection off the laser facet and the external cavity, changes in this interference (in particular, changes in the relative phase of the interfering beams) will cause the side mode suppression to change. Small changes directly change the "side mode suppression ratio." If the change is large enough, a side mode will be less suppressed than the lasing mode and the laser will commence lasing on the side mode. Such a change in lasing mode changes the laser wavelength, and is called "tuning."

Returning to the laser spectrum graph of FIG. 2, when the wave is translated (that is, the phase of the wave may be changed) when the relative phase of the laser facet reflection is changed relative to the external feedback. Let us first assume that the lasing mode rides on a crest, in a trough, or somewhere in-between.

Under ideal conditions, the side modes will be at the same phase of the wave as the lasing mode. For example, when the lasing mode is at a crest then the side modes are also at a crest. In accordance with the example spectrum of FIG. 2 the period of the wave is 75 GHz, which also corresponds to the free spectral range (FSR) of the gain media. (=2 nL/c). The preferred side mode distance is then also 75 GHz. In one embodiment, a 75 GHz FSR laser diode is used for gain media 12 along with a 75 GHz grid generator for the intracavity filter 28. The embodiment is referred to as being "locally commensurate."

Figure 3:
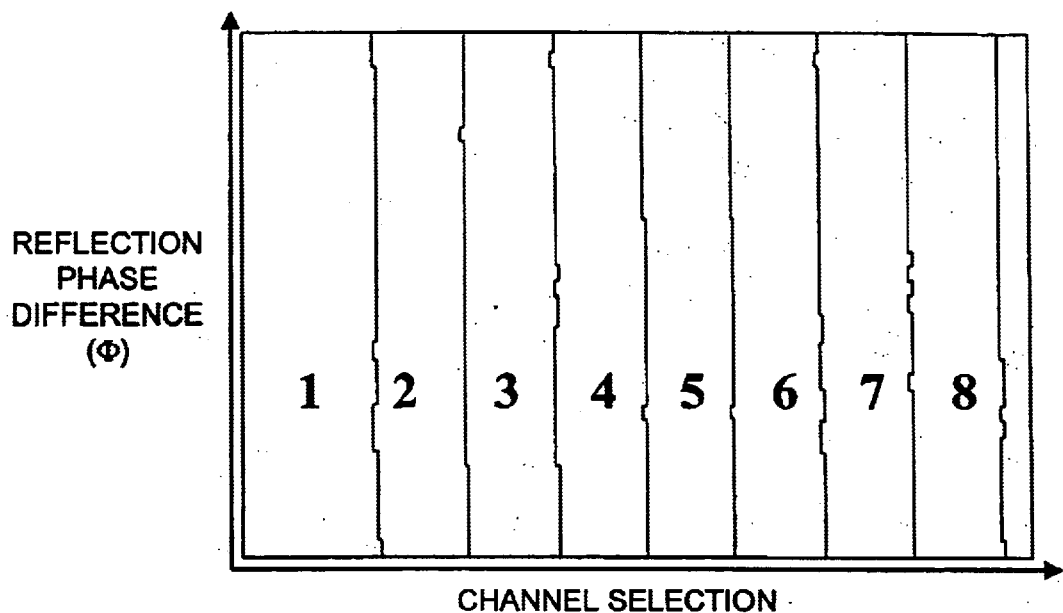
FIG. 3 is a graph illustrating a reflection phase difference vs. channel selection (wavelength frequency) corresponding to an ideal "locally commensurate" configuration.

Details of the tuning behavior for a 75 GHz grid generator and 75 GHz FSR laser diode are shown in FIG. 3. In the figure, the different cross-hatch intensities are representatives of respective lasing frequencies. The reflection phase is represented by the vertical lines, while the position of the tuning filter corresponds to the horizontal position. As illustrated by FIG. 3, the channels show distinct separation at all reflection phase angles.

In another embodiment, the intracavity filter 28 has a free spectral range of 50 GHz, which corresponds to the wavelength spacing of the ITU channels used in DWDM telecommunication systems, and accordingly does not have a FSR of 75 GHz (or multiple thereof), which would make the filter "locally commensurate" with the FSR of the laser diode (75 GHz). Since the side modes in this embodiment are 50 GHz from the lasing mode, when the lasing mode is on a "crest" the side modes are not on the crest, but fall partway into the troughs. As the phase of the wave is changed (by changing the relative phase of the two reflections), the laser mode will move off the crest (i.e., will see additional filtering as the two waves begin to interfere destructively) and the side modes will (eventually) move out of the trough unto a crest (i.e., will see less filtering as the waves begin to interfere more constructively). If the change in filtering between the laser mode and the side mode is large enough so that the side mode becomes favored over the laser mode, the laser will tune to the side mode.

Figure 4:
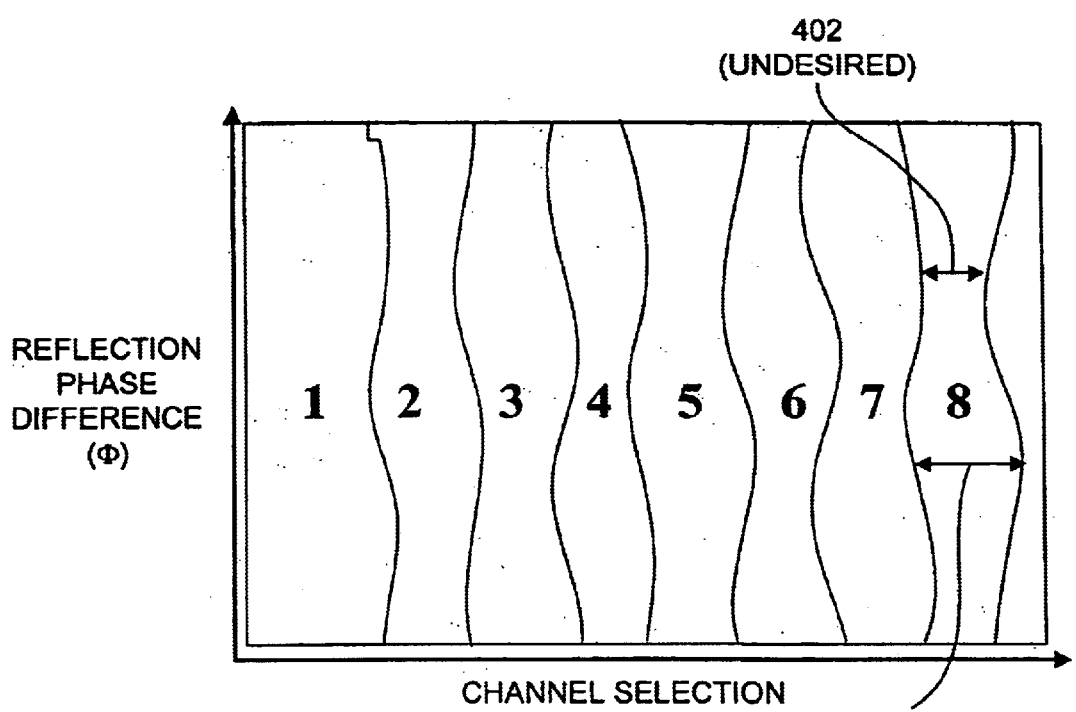
FIG. 4 is a graph illustrating a reflection phase difference vs. channel selection for a typical laser configuration that is not "locally commensurate."

As shown in FIG. 4, the tuning behavior is not completely determined by the external cavity filtering (horizontal axis). The relative phase of the laser facet reflection relative to the external cavity reflection (φ corresponding to the vertical axis) also affects the tuning. When operating on a given channel (i.e., color band in FIG. 4), it is desirable to operate at a laser facet phase (vertical axis) where the channel is "wide" rather than where the channel is "narrow," as respectively depicted by channel widths 500 and 502. First, the power is higher where the channels are wide (not shown). Second, the cavity length servo can be unstable where the channels are narrow. Third, (for higher facet reflection than shown in FIG. 4) the waist may be so narrow that it is impossible to reach a particular channel without changing the relative phase.

Figure 5:
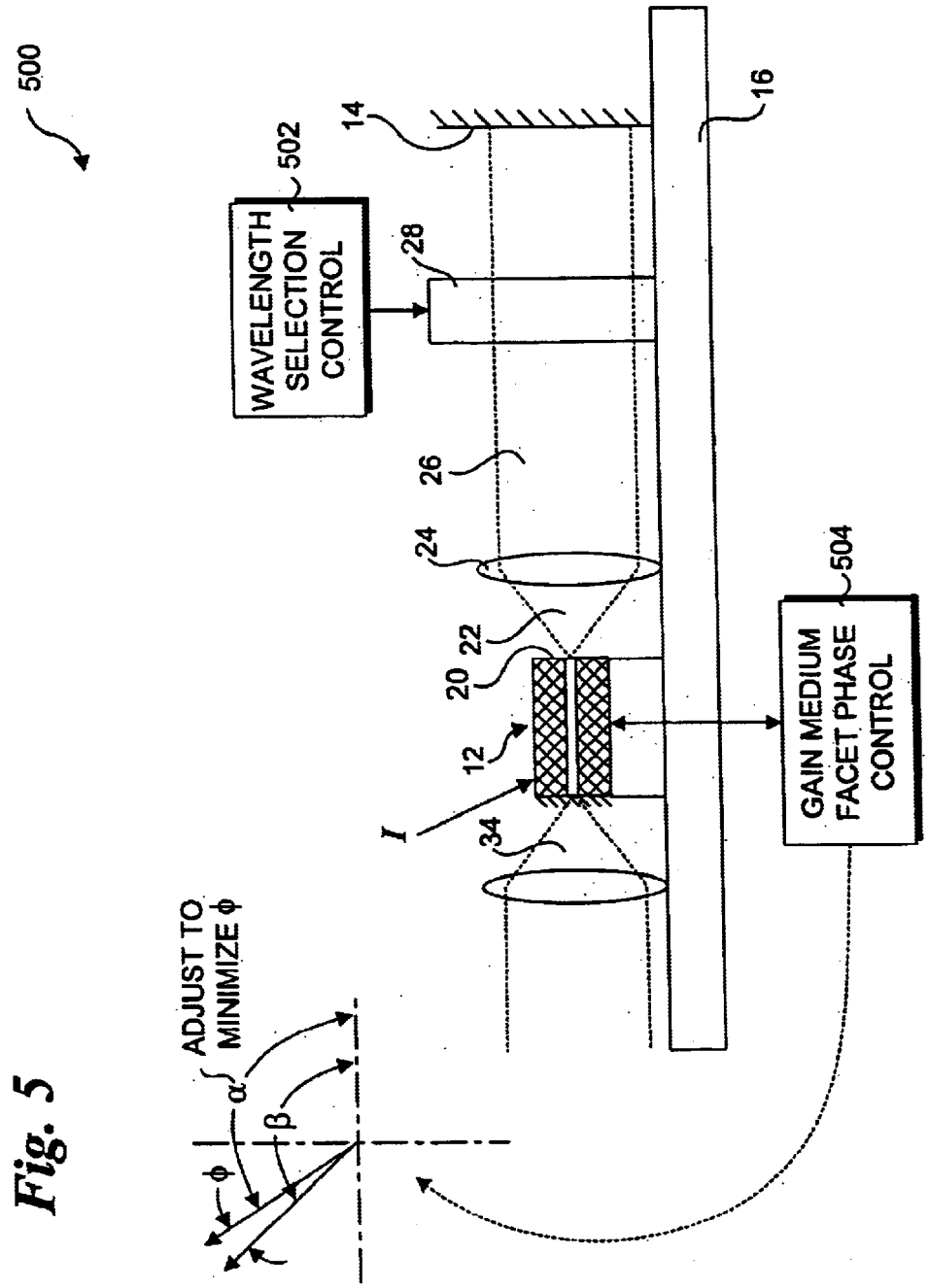
FIG. 5 is a schematic diagram illustrating an overview of a external cavity laser that adjusts the reflection phase difference in accordance with one embodiment of the invention.

For these reasons, it is desirable to adjust the relative phase φ of the laser reflection during operation. In accordance with aspects of the invention, a generalized embodiment of the invention for accomplishing this task is shown in FIG. 5 as an ECL apparatus 500. The basic components of ECL apparatus 500 are similar to illustrated in the conventional apparatus of FIG. 1. In addition, a wavelength selection control means 502 has been added to enable selection of a particular channel based on predefined channel/wavelength assignments. More importantly, the apparatus includes a gain medium facet phase control means 504 that enables the laser facet phase to be adjusted so as to minimize the relative reflectivity phase angle φ.

The primary mechanism for adjusting the relative phase is to change the optical path length of the gain media. As described below in further detail, in one embodiment this is accomplished by changing the temperature of the gain media via controlling the temperature of a temperature-controllable "sled" to which the gain media is thermally coupled. In another embodiment, the gain media includes a "phase control" section via which the optical path length of the gain media may be adjusted by controlling the current injection into the phase control section. (A phase control region is similar to the gain region except that the region has been tailored to have a large phase change and small absorption/gain change by moving the bandgap further away from the operating wavelength.)

Figure 6:
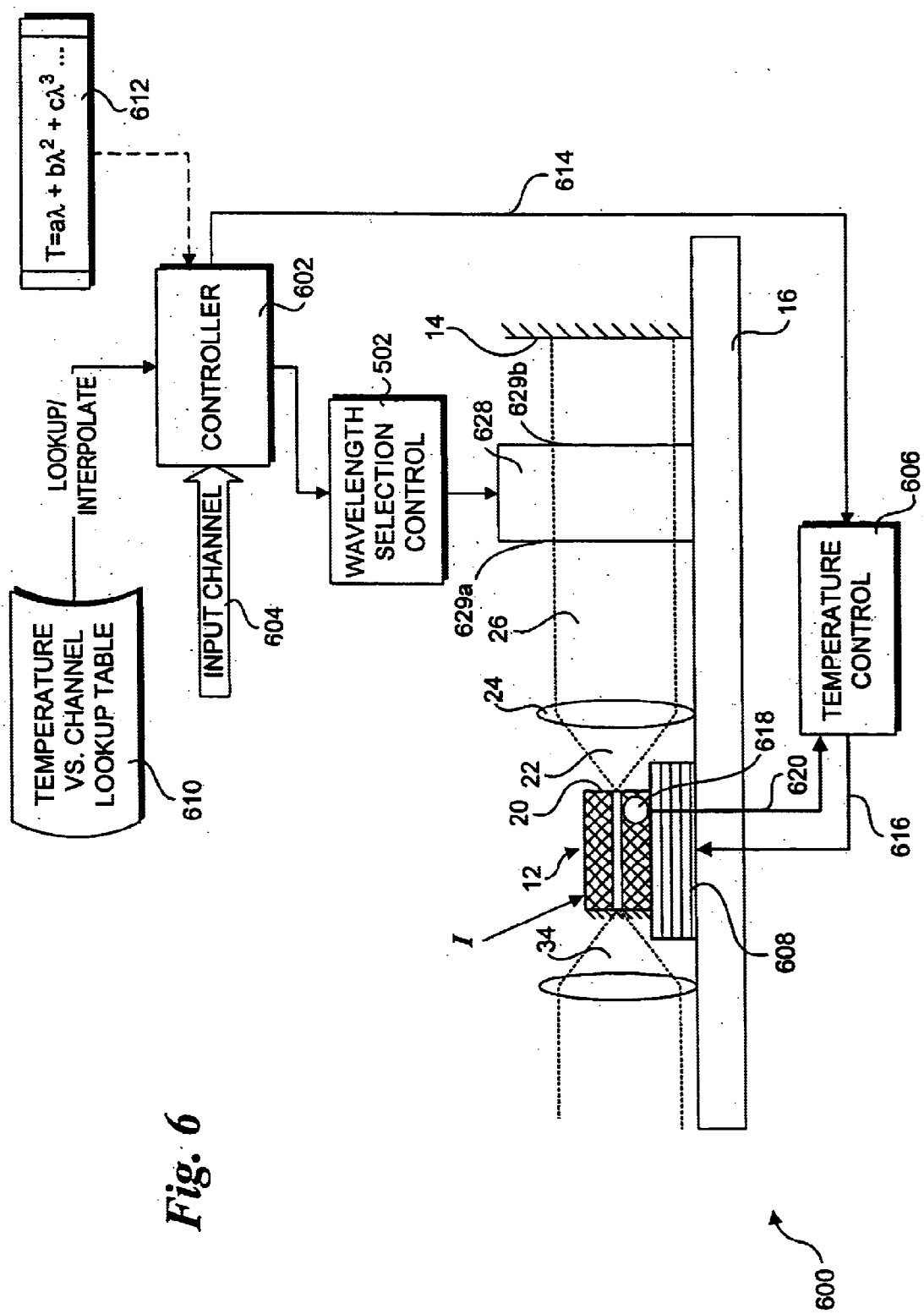
FIG. 6 is a schematic diagram of an external cavity laser that employs temperature control of the gain medium to adjust the reflection phase difference.

With reference to FIG. 6, an ECL apparatus 600 in accordance with a first temperature control-based embodiment is illustrated. This embodiment further includes a controller 602 that tunes the laser in response to an input channel command 604. The controller is linked in communication with a temperature control module 606, which controls the temperature of a temperature-controllable gain medium sled 608 that is thermally coupled to gain medium 12, thereby enabling the temperature of gain medium 12 to be accurately controlled. The controller is also used to control wavelength selection control means 502.

The optical path length of the gain medium is a function of the gain medium material's index of refraction n times its length L. Semiconductor gain medium materials such as InGaAs and InGaAsP have generally high refractive indices, while also exhibiting relatively large changes in refractive index with respect to temperature. Gain medium refractive index adjustment can be effectively carried out by temperature control of gain medium 12, by heating and cooling thereof by temperature controllable gain medium sled via control input from temperature control module 606.

As described below in further detail, in one embodiment during calibration of the apparatus a temperature vs. channel (or wavelength frequency) lookup table 610 is generated. Then, during operation, a target laser temperature may be determined by interpolating between points in the lookup table corresponding to the desired input channel. In an optional embodiment, a polynomial equation (or set of equations) may be derived from the laser temperature vs. wavelength frequency calibration data, and then during operation the target temperature can be determined from the polynomial equation based on the wavelength for the desired channel, as depicted by a pre-defined polynomial equation process 612.

During operation, the controller sends a control command or signal 614 to temperature control module 606. Depending on the particular temperature control means (i.e., combination of the controller and the thermal element(s)), temperature control module 606 may be a standalone component, may be integrated into gain medium sled 608, or may be a part of controller 602. In response to the control command or signal, temperature control module 606 will generally generate an appropriate electronic input 616 to drive gain medium sled 608. Typically, temperature-controllable gain medium sled will comprise one or more a thermoelectric elements coupled to a thermal mass, such as a heat sink or the like. The objective is to provide a thermally-controlled element that has sufficient thermal mass to effectively control the temperature of the gain medium. Generally, the thermal mass will comprise a thermally conductive material such as a metal, metal oxide, metal nitride, metal carbide, or alloys, blends, mixtures, or composites thereof.

In one embodiment the gain medium 12 is thermally coupled to the sled such that temperature control module 606 can control the temperature of the gain medium via thermal conduction between the sled and the gain medium. "Thermally-coupled," as used herein means any mounting or coupling arrangement or configuration that provides effective heat transfer for thermal control of the thermally-coupled components. Although shown as being disposed beneath gain medium 12, the gain medium sled may generally comprise any thermally-controllable element that is thermally coupled to a suitable gain medium. Typically, thermally conductive adhesives or solders may be used to thermally-couple the gain medium to the sled.

Generally, the thermoelectric element(s) employed in the gain medium sled will comprise resistive-type elements, although other types of heating elements may be used. In addition, electric cooling elements may also be employed, such as Peltier-effect devices (also generally known as thermoelectric (TE) coolers). The overall objective is to be able to precisely control the temperature of the gain medium through precise control of the gain medium sled via controlled electric input to the gain medium sled.

Preferably, a closed loop feedback scheme will be employed to control the temperature of gain medium sled 608 and/or gain medium 12. For example, such a feedback scheme may employ a temperature sensor 618 that sends a temperature signal 620 back to temperature control module 606. Other types of control schemes common to temperature control devices may also be used, such as current control. If the thermal mass of the gain medium sled is much larger than the thermal mass of the gain medium, an open loop temperature control scheme may be sufficient for controlling the temperature of the gain medium.

ECL apparatus 600 further includes an intracavity wavelength selection element 628. Wavelength selection element 628 may comprise one or more etalons, gratings, prisms or other element or elements that are capable of providing feedback to gain medium 12 along path 26 at a selected wavelength. In the as depicted in FIG. 6, wavelength selection element 628 is shown as a single etalon that operates as a Fabry-Perot interference filter. Wavelength selection element 628 is configured to have a free spectral range such that the interference between faces 629a, 629b results in a single transmission peak within a wavelength range of interest such as, for example, the gain bandwidth of gain medium 12, the wavelength range of the ITU (International Telecommunications Union) "C" -band (approximately 192.1 THz to approximately 196.1 THz or approximately 1525 to approximately 1565 nanometers), or other wavelength range. The wavelength maximum of the single transmission peak is tunable by adjustment of wavelength selection element 628 by one or more of the tuning mechanisms discussed below. A grid etalon (not shown) may also be included in path 26, with the grid etalon configured to generate a plurality of transmission peaks corresponding to selectable wavelengths such as the ITU channel wavelengths.

The single transmission peak provided by wavelength selection element 628 allows feedback of light at the transmission peak wavelength to gain medium 12 along path 26, while suppressing potential feedback at other wavelengths which may arise due to modes associated with the external cavity defined by gain medium facet 18 and end reflector 14, transmission maxima associated with a grid generator etalon (not shown) that may be present within the external cavity, or other possible undesired feedback that is not at the selected wavelength. The finesse of wavelength selection element 628 may be configured as needed to provide for effective suppression of feedback within the external cavity at wavelengths other than the single transmission peak defined by wavelength selection element 628. One or more additional filter elements (not shown) may also be used in the external cavity to suppress feedback to gain medium 12 at unselected wavelengths.

A wavelength selection controller or control element 502 is operatively coupled to wavelength selection element 628, and provides for adjustment or selection of the wavelength of the transmission peak defined by wavelength selection element 628, and hence the wavelength of light that is fed back to gain medium 12. Control element 34 may comprise a conventional data processor for generating tuning signals, as well a physical mechanism or system for implementing the tuning. Optionally, such functionality may be directly provided by controller 602. Wavelength selection element 628 may be tunable by various mechanisms, including thermo-optic, electro-optic, acousto-optic, and piezo-optic tuning, mechanical angle tuning, strain-based tuning, or other tuning mechanism or combination of tuning mechanisms, in order adjust the wavelength of the light that is returned to gain medium 12 along path 26. The use of mechanically tuned tapered interference filters and wedge-shaped etalons, transmissive and reflective gratings, and electro-optically tuned etalons for wavelength selection is described, for example, in co-pending U.S. patent application Ser. No. 09/814,464. The use of reflective gratings for wavelength selection is also described in co-pending U.S. patent application Ser. No. 10/099,730. The use of thermo-optically tuned etalons and etalons of birefringent material are disclosed in co-pending U.S. patent application Ser. No. 10/099,649. Each of the aforementioned disclosures are incorporated herein by reference. In embodiments where a reflective grating is used, end reflector 14 may be positioned in a Litmann-Metcalf arrangement to return a selected diffraction back to the gain medium 12, or, in a Littrow arrangement, end reflector 14 may be omitted, as the grating is positioned to return a selected diffraction directly to the gain medium 12, as described below with reference to FIG. 8. Other types of wavelength selection elements and tuning mechanisms therefore may suggest themselves to those skilled in the art, and are also considered to be within the scope of this disclosure.

In operation of the ELC apparatus 600, current I is applied to gain medium 12 in a conventional manner. The beam 22 emitted from facet 20 of gain medium 12 travels along path 26 and passes through or otherwise interacts with wavelength selection element 628. Wavelength selection element 628 is tuned or adjusted to provide transmission along path 26 at a selected wavelength, and light at the selected wavelength is returned along path 26 to gain medium 12 from wavelength selection element 628 to support lasing in the external cavity at the selected wavelength. Feedback to gain medium 12 at other wavelengths is suppressed by wavelength selection element 628 to prevent multi-mode lasing.

During operation of ECL apparatus 600 in the above manner, the optical path length of the gain medium is thermally adjusted to adjust the phase of the laser facet reflection such that the relative phase angle $\phi$ between the laser face reflection phase angle $\alpha$ and the external cavity reflection phase angle $\beta$ is minimized, thereby producing a in phase relationship. Thermal control of the external cavity optical path length is achieved in accordance with embodiments of the invention by heating and/or cooling temperature-controllable sled via temperature control module 606 to provide temperature control of gain medium refractive index via thermal conduction with gain medium 12.

Figure 7:
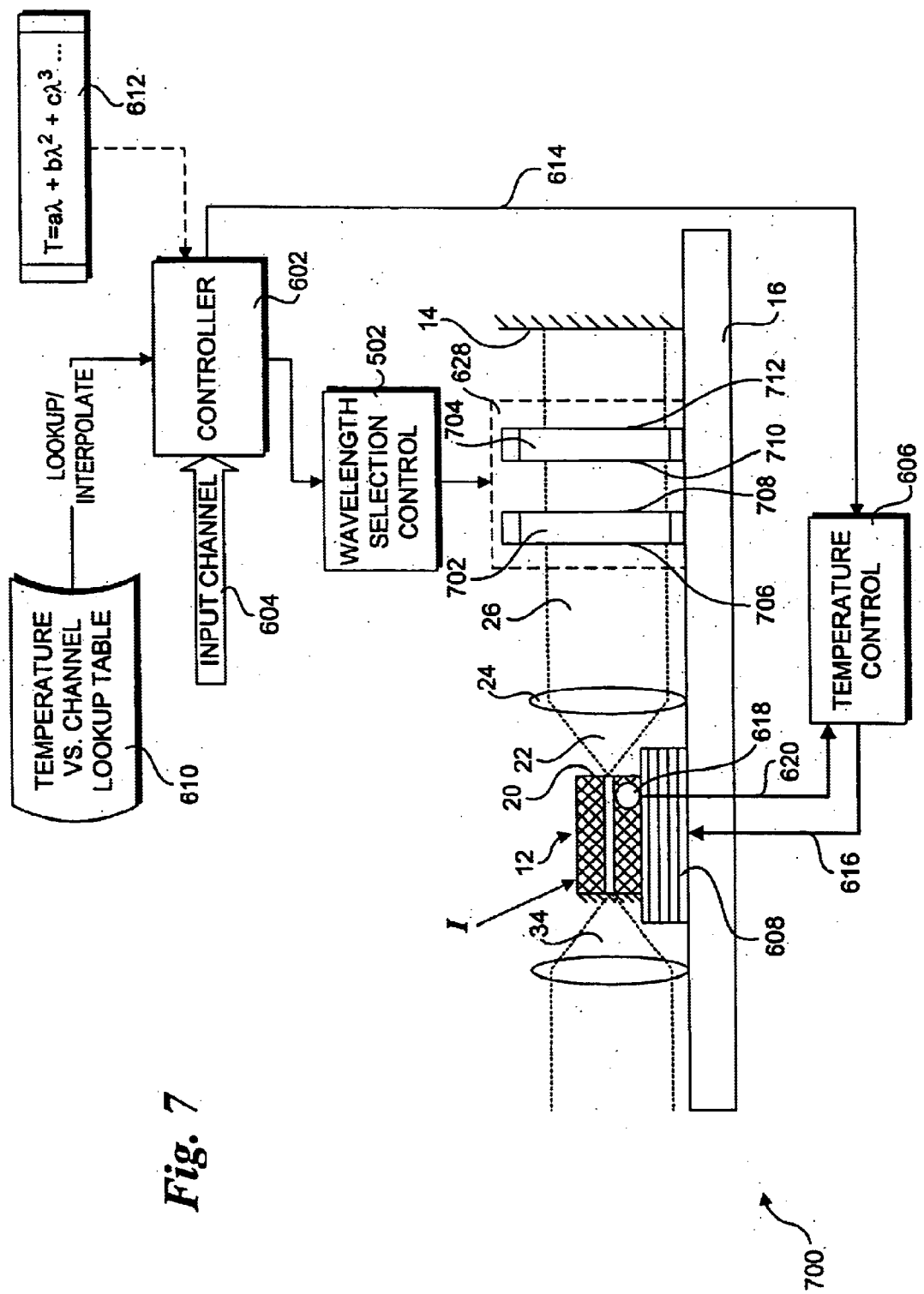
FIG. 7 is a schematic diagram illustrating a variation of the embodiment of FIG. 6 in which a pair of intracavity etalons are employed as wavelength selection control element.

Referring now to FIG. 7, an external cavity laser apparatus 700 in accordance with an embodiment of the invention is shown. The ECL apparatus 700 has a wavelength selection element 628' that comprises first and second tunable etalons 702 and 704. The first and second tunable etalons 702, 704 are positioned within the external cavity defined by end reflector 14 and gain medium facet 18. Tunable elements 702, 704 are operable together to preferentially feed back light of a selected wavelength to gain medium 12 during operation of ECL apparatus 700. Etalons 702, 704 are shown in the form of first and second tunable Fabry-Perot etalons, which may comprise parallel plate solid; liquid or gas spaced etalons, and which may be tuned by precise dimensioning of the optical thickness or path length. In other embodiments, etalon 702 and/or etalon 704 may be replaced with a grating, prism, thin film interference filter, or other tunable element.

First etalon 702 includes faces 706, 708, and has a first free spectral range FSR, according to the spacing between faces 706, 708 and the refractive index of the material of etalon 702. Second etalon 704 includes faces 710, 712, and has a second free spectral range $FSR_2$ defined by to spacing between faces 710, 712 and the refractive index of the material of etalon 204. Etalons 704, 706 may comprise the same material or different materials with different refractive indices. Etalons 702, 704 each are tunable by adjustment of their optical thickness, to provide for adjustment or tuning of $FSR_1$ and $FSR_2$, which in turn provides selective wavelength tuning for ECL apparatus 700 as described further below. Tuning of etalons 702, 704 can involve adjustment of the distance between faces 706, 708 and 710, 712 of etalons 702, 704 and/or adjustment of the refractive index of the etalon material. Various tuning mechanisms involving using various techniques may be used, including thermo-optic, electro-optic, acousto-optic, piezo-optic, mechanical, or other tuning to vary refractive index of etalon material and/or vary the spacing of etalon faces. More than one such tuning effect may be applied simultaneously to one or both etalons 702, 704, depending upon the particular embodiment of the invention. Details for thermal-optically tuning etalons 702, 704 are disclosed in U.S. patent application Ser. No. 10/099,649, the specification and drawings of which are incorporated herein by reference.

Figure 8:
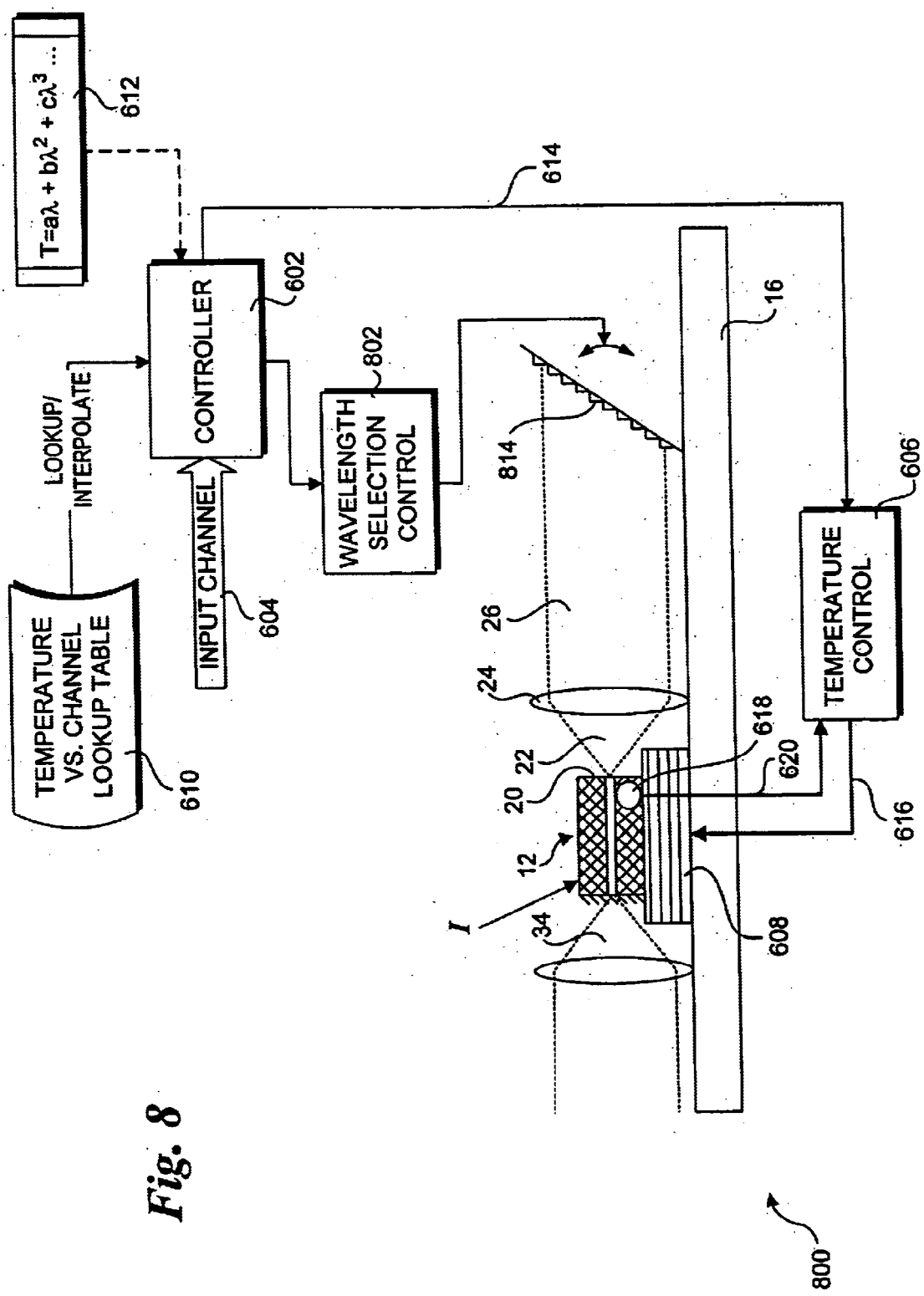
FIG. 8 is a schematic diagram illustrating an optional configuration in which a Littrow grating is employed as the reflective element in the external laser cavity.

An ECL apparatus 800 that employs a Littrow grating 814 is shown in FIG. 8. Littrow gratings are commonly used in optical communication systems for wavelength selection. Littrow gratings can be made with very small wavelength spacing, and are well-suited for DWDM systems. Depending on the particular implementation, Littrow grating 814 may be coupled to a mechanical actuator (not shown) that is used to tilt the grating a very small amount for tuning. For example, a moveable platform employing a piezoelectric crystal may be used for such purposes. In this event, the actuator position may be controlled by either a wavelength selection control means 802 or directly by controller 602.

Figure 9A:
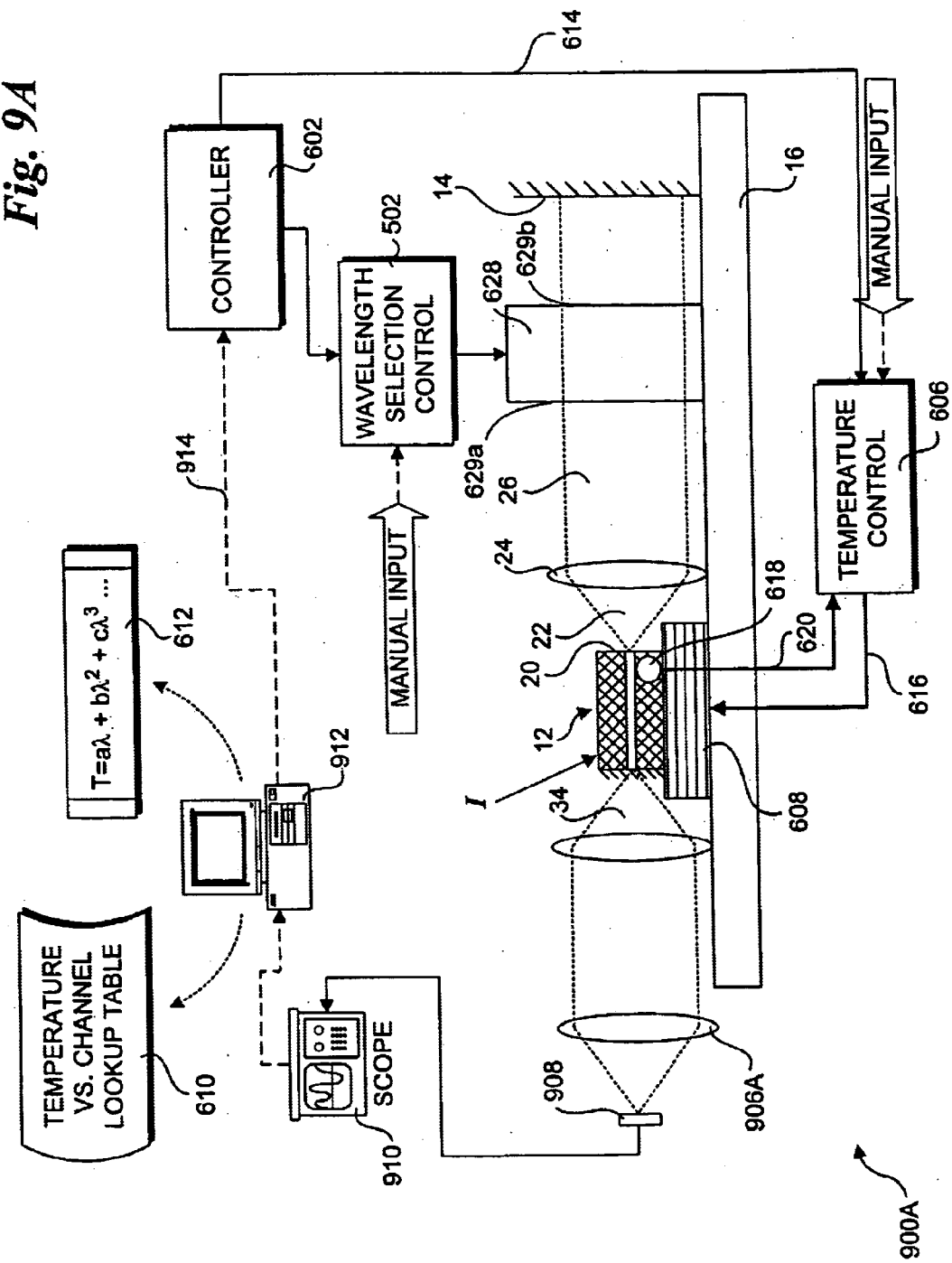
Figure 9B:
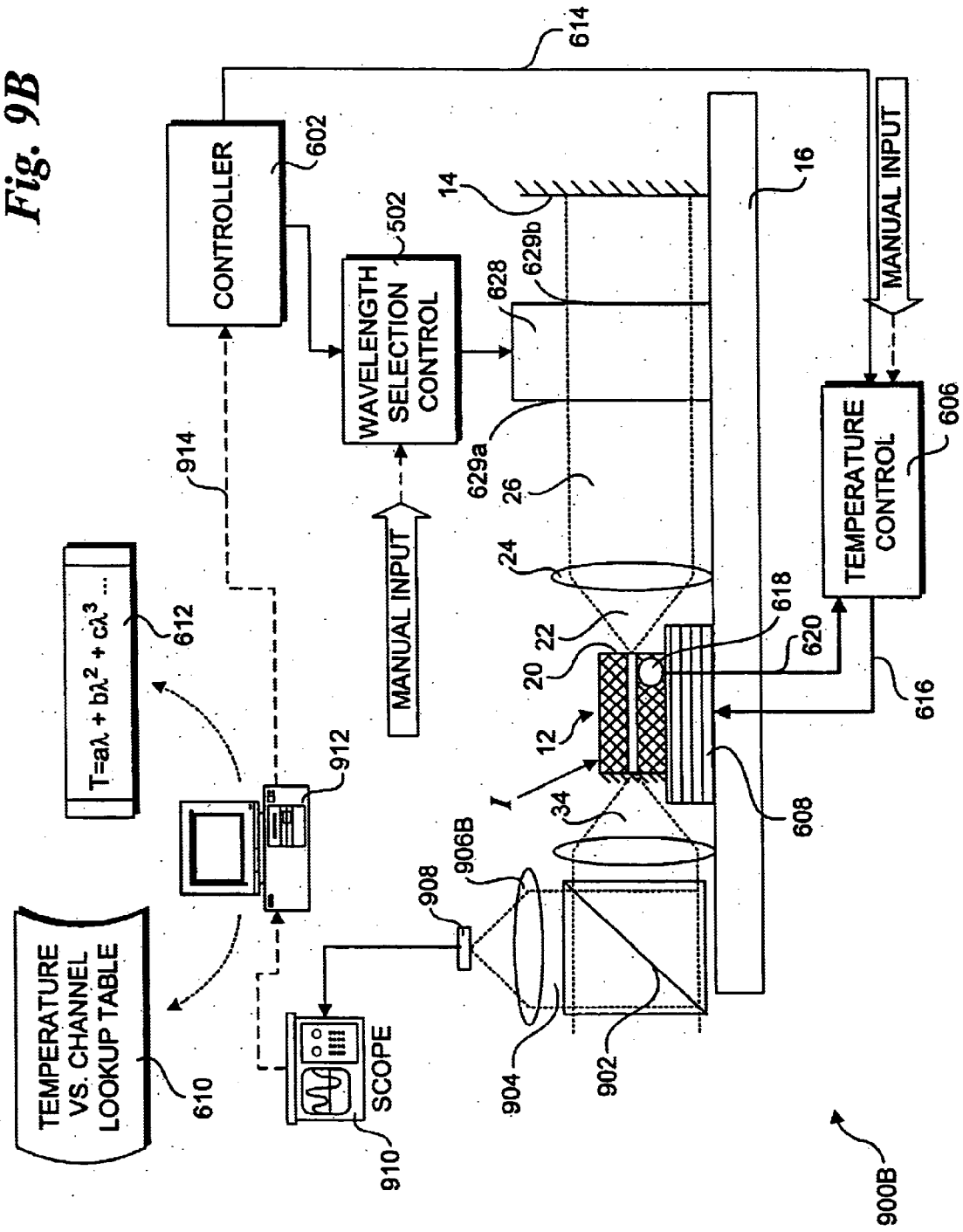

Respective calibration system 900A and 900B, which may be used to calibrate ECL apparatus 600, 700, and 800 are shown in FIGS. 9A and 9B. In calibration system 900A, a lens 906A is placed in the path of the collimated beam produced by ECL apparatus 600, 700, or 800 to focus the beam on a photodetector 908. In calibration system, a beam splitter 902 is placed so as to redirect a portion of the ECL apparatus output beam 34 as light beam 904. This portion of the light beam passes through a lens 906B, which focuses the light beam onto a photodetector 908. The photodetector, which is used to measure the power of light beam 804 (and thus indirectly of output beam 34 in the beamsplitter embodiment), is coupled to an electronic measurement device, such as an oscilloscope 910. Other output power measurement schemes and devices may also be used, such as those that measure laser voltage, optical power out of the back of the laser, etc. In each case, a power signal or the like would be provided to the electronic measurement device. In one embodiment, the oscilloscope (or other electronic measurement device not shown) is linked to a computer 912 through one of several communication interfaces, such as a GPIB (general purpose instrumentation bus) interface, a serial or parallel interface, a USB interface, etc. Optionally, observations of the oscilloscope may be manually entered into computer 912.

In one embodiment, calibration systems 900A and 900B are configured to automatically calibrate the ECL apparatus. In this instance, computer 912 is linked in communication with controller 602 and provides a control signal or command 914 to the controller. Optionally, wavelength selection control 502 and/or temperature control 606 may be manually controlled. During the calibration procedure a set of operating parameters are determined by selecting wavelengths corresponding to respective channels as the lasing frequency and then adjusting the temperature of gain medium 12 until a maximum power output is measured at photodetector 908. The temperature at the maxima are then recorded, either automatically or manually. Upon completion of the calibration process, a corresponding temperature vs. channel lookup table 610 may be built and/or a polynomial function relating the temperature to the wavelength frequency may be defined.

In accordance with results from calibration of an exemplary ECL apparatus, a temperature change of about 6 degrees centigrade is sufficient to cycle through the phases of a 600 micron InGaAsP Fabrey-Perot gain media. Thus, a set of temperatures, differing by 6 degrees each, all achieve the same laser phase. Of this series, one is selected by some criteria. For example, in one embodiment the temperature should be as close to 23 degrees (C) as possible, e.g., 23+/−3 C.

It may also be desirable to determine the correct laser phase (laser temperature) during laser operation. This may be achieved with a fast or slow servo control loop. Since output power (and laser voltage, power out the back of the laser, and other signals) are a function of the laser phase, this signal can be monitored as the laser temperature is dithered between two or more temperature. The temperature that gives the higher power also has the better laser phase. This temperature is chosen as the new operating point and the laser temperature is dithered about this point, etc. For this servo to function, the laser reflectivity must be high enough to give a reliable signal. If the laser reflectivity is too low (on a particular unit), then the servo is not used and it is not needed because the laser reflectivity is too low to perturb the system. During operation, the AR-coating on the laser facet degrade over time (due to aging effects, outgassing accumulation on the cooled diode, etc.) and the laser may age from a system where the laser temperature servo is not needed to one where a laser temperature servo is needed.

Figure 10:
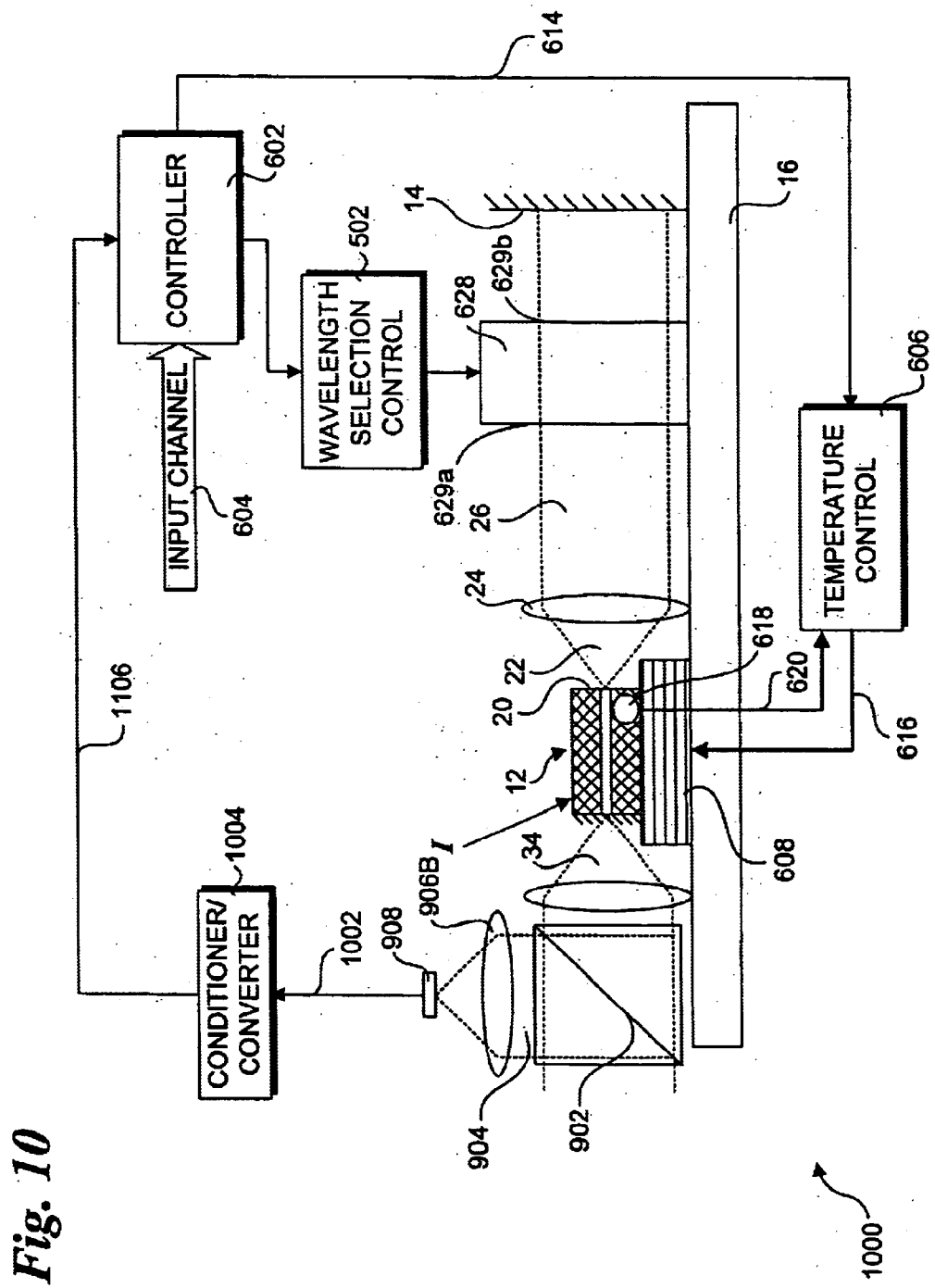
FIG. 10 is a schematic diagram illustrating an external cavity laser in which a servo loop is implemented to continuously adjust the laser facet reflection phase so as to produce an output beam having a maximum power level.

An ECL apparatus 1000 employing a generalized closed loop servo control system is shown in FIG. 10. In the illustrated configuration, the apparatus employs a beam splitter 902 to redirect a portion of the output beam produced by gain media 12 towards a photodetector 908 in a manner similar to that shown in FIG. 9B and discussed above. Optionally, other types of output beam power measurement schemes may be employed. The photodetector generates an unconditioned output signal 1002 inn response to the portion of light it receives. This signal, which will generally comprises a voltage or current, is conditioned and/or converted (e.g., into a digital signal) at a conditioner/converter block 1004 to produce a conditioned signal 1006 that is received as a feedback signal at controller 602. As described next, this closed loop servo scheme may be used to dynamically adjust the gain media temperature so as to produce a maximum signal power under variable operating conditions.

Figure 11A:
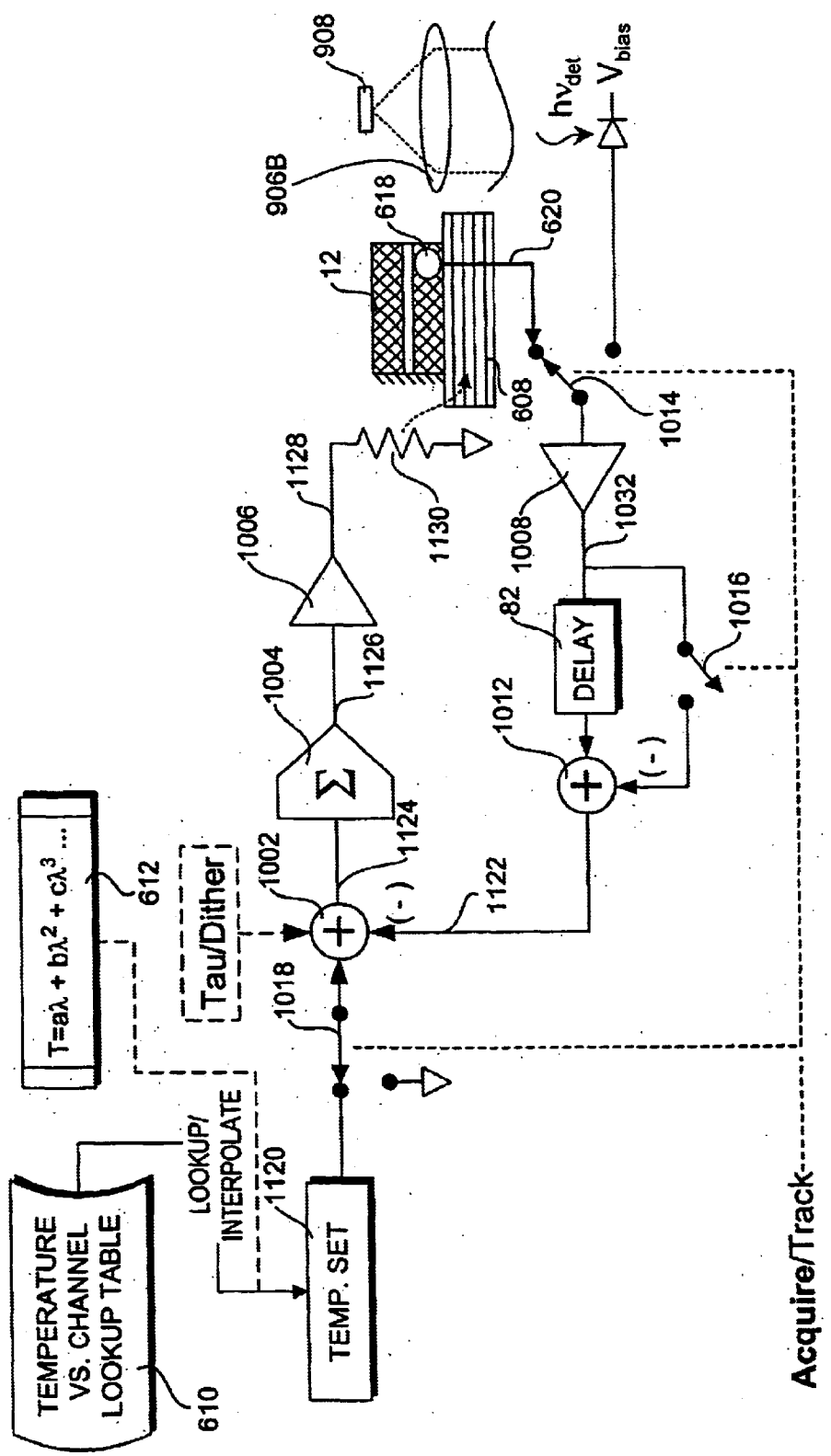
Figure 11B:
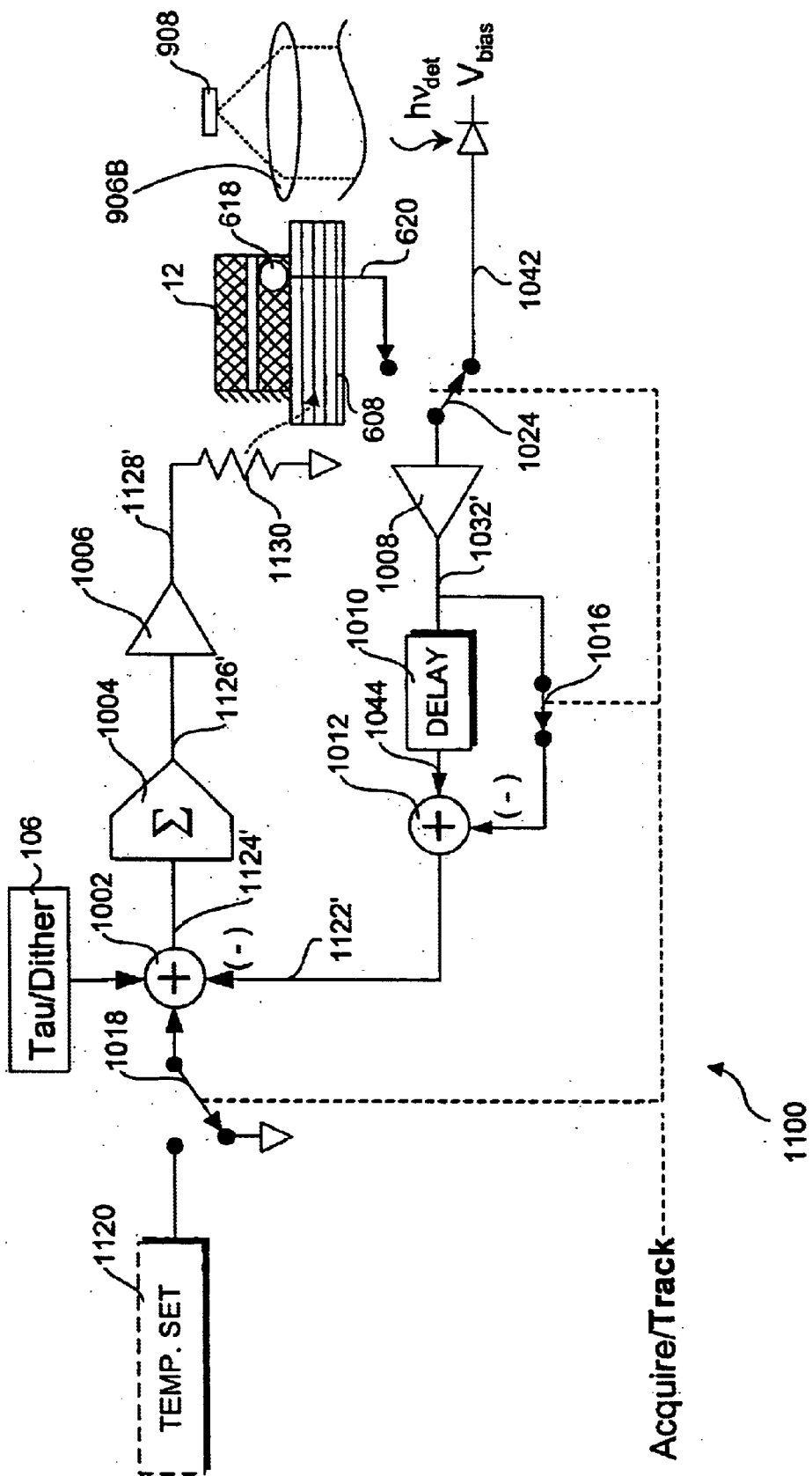

An exemplary servo control loop 1000 suitable for providing closed loop servo control for the ECL apparatus described herein is shown in FIGS. 11A and 11B, wherein the control system operates in an Acquire mode in FIG. 11A, and a Tracking mode in FIG. 11B. Servo control loop 1000 includes a summing block 1002, an integrator 1004, an amplifier 1006, an amplifier 1008, a delay block 1010, and a summing block 1012. Switches 1014, 1016, and 1018 are used to switch between the Acquire mode and the Tracking mode shown.

With reference to FIG. 11A, servo control loop 1000 works in the following manner when in the Acquire mode. The Acquire mode is used to initially set the gain media temperature at a predetermined target temperature corresponding to the selected input channel, at which point the Tracking mode can be implemented. Accordingly, this desired temperature is called the pre-tracking temperature.

A temperature set signal 1120 corresponding to a voltage based on the pre-tracking temperature is received as an external input at summing block 1002, from which a feedback signal 1122 is subtracted. In a manner similar to that discussed above with reference to FIG. 6, the pre-tracking temperature for a particular channel may be determined via interpolation of temperature vs. channel lookup table 610 or from predefined polynomial equation process 612. The resultant error signal 1124 is fed into integrator 1004, which outputs an integrated error signal 1126 that is received by amplifier 1006 to generate a current 1128 that drives heating and or cooling elements present in temperature controllable gain medium sled 608, as depicted by a resistor 1130. In response, the temperature of the sled may be increased or decreased, as appropriate. This temperature is measured by temperature sensor 618 (which may be thermally-coupled to either the gain media or the sled), which produces a temperature feedback signal 620. This signal is received as an input to amplifier 1008 via switch 1014, producing an amplified temperature feedback signal 1032. As switch 1016 is open in the Acquire mode, the signal produced by delay block 1010 corresponds to feedback signal 1122 since this signal is the only one signal going into summing block 1012, which acts as a simple pass through in this instance, thereby completing the loop. As will be recognized by those skilled in the art, signal 1124 represents an error signal that will be reduced over time until the desired target temperature is reached (under a steady state condition).

The Tracking mode is used to finely tune the temperature of the gain medium to produce a maximum power output.

With reference to FIG. 11B, servo control loop 1100 works in the following manner when operating in the Tracking mode. In this mode, a Tau/Dither signal 1140 used for finely adjusting the sled gain media is received at summing block 1002, from which a feedback signal 1122' is subtracted to produce an error signal 1124'. In the Tracking mode, there is no input from temperature set 1120, so switch 1018 is moved to tie the signal line to ground, or other reference voltage. As before, error signal 124' is integrated by integrator 1004 to produce an integrated error signal 1126', which is then input to amplifier 1006 to produce a current 1130 that drives heating/cooling element(s) 1130. As discussed above, the objective in the Tracking mode is to adjust the gain media temperature to produce a maximum power output (energy level) of the optical beam produced by the ECL apparatus. For simplicity, the energy level is represented by $hv_{det}$, which is measured at a detector 908.

Therefore, detector 908 will produce a signal 1042' that is a function of the gain medium temperature and is received by amplifier 1008, which produces an output signal 1032'. Signal 1032' is then fed into delay block 1010 to produce a delayed signal 1044 that is received by summing block 1012. In contrast to the Acquire mode, switch 1016 is closed in the Tracking mode, thereby enabling signal 1032' to be provided as a negative input to summing block 1012. As a result, signal 1032' is subtracted from delayed signal 1044, thereby providing a differentiation function, i.e., Dv/Dt, the results of which comprise feedback signal 1122'.

As will be recognized by those skilled in the art, servo control loop 1100 may be implemented using conventional analog and/or digital blocks, or the entire servo control loop may be implemented digitally using an appropriately programmed digital signal processor, ASIC (application specific integrated circuit), microcontroller or similar type of processing device.

Figure 12:
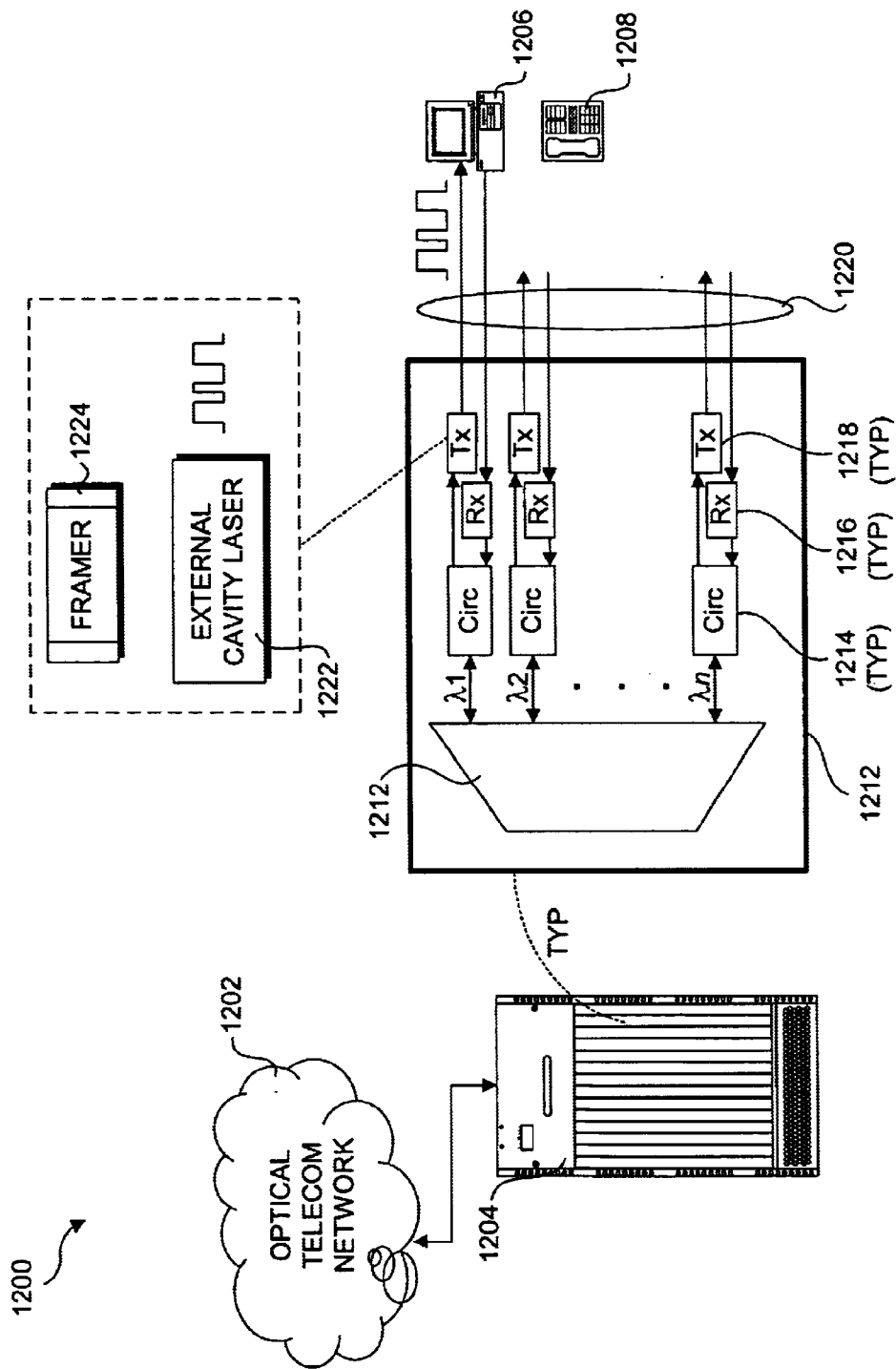
FIG. 12 is a schematic diagram of a communication network including a network switch in which tunable external cavity lasers in accordance with embodiments of the invention may be deployed.

FIG. 12 shows a communication system 1200 in accordance with an embodiment of the invention in which an optical network is coupled to a plurality of data and voice subscribers lines by an optical mux/demux utilizing ECLT's tunable to the center frequency of any of the WDM channels on the optical network. The communication system includes an optical network 1202, a network switch 1204, a data terminal 1206, and a voice terminal 1208. The modulated data may be carried on a number of channels in multiple access protocols including but not limited to: wavelength division multiplexing (WDM), dense wavelength division multiplexing (DWDM), frequency division multiple access (FDMA), etc. Currently, this expansion of bandwidth is primarily being accomplished by WDM, in which separate subscriber/data session may be handled concurrently on a single optical fiber by means of modulation of each of those subscriber datastreams on different portions of the light spectrum. The precise center frequencies of each channel are specified by standard setting organizations such as the International Telecommunications Union (ITU). The center frequencies are set forth as part of a wavelength grid that defines the center frequencies and spacing between channels. Typically, the grid spacing is even and occurs at integer multiples of a selected fundamental frequency.

Network switch 1204 provides network switching operations, as is well-known in the art. This is facilitated by optical transceivers that are mounted on fiber line cards 1210. Each fiber line card includes a multi-state multiplexer/demultiplexer (mux/demux) 1212, a circulator bank including circulators 1214, a receiver bank including receivers 1216, and a transmitter bank including transmitters 1218. The mux/demux is a passive optical device that divides wavelengths (or channels) from a multi-channel optical signal, or combines various wavelengths (or channels) on respective optical paths into one multi-channel optical signal depending on the propagation direction of the light.

In the receive mode, after de-multiplexing, each individual channel is passed via a corresponding circulator 1214 within the circulator bank to a corresponding receiver 1216 in the receiver bank. Each receiver 1216 includes a narrow bandpass photodetector, framer, and decoders (not shown). Switches (not shown) couple the receiver over a corresponding one of subscriber lines 1220 to a voice or data terminal 1206 or 1208, respectively.

In the transmit mode, each line card transmitter bank includes a bank of lasers 1222, including n (e.g., 128) ECLs radiating light at one of the selected center frequencies of each channel of the telecommunications wavelength grid. The wavelength range of current ITU-defined grids is 1525–1575 nm. Each subscriber datastream is optically modulated onto the output beam of a corresponding ECL having a construction and operation in accordance with the embodiments of the invention discussed above. A framer 1224 permits framing, pointer generation and scrambling for transmission of data from the bank of ECLs and associated drivers. The modulated information from each of the lasers is passed via a corresponding circulator into mux/demux 1212, which couples the output to a single optical fiber for transmission. The operation of the fiber line card in the embodiment shown is duplex, meaning that bi-directional communications are possible.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A tunable external cavity laser apparatus, comprising:
a gain medium having first and second at least partially-reflective facets defining a facet laser cavity in which a first portion of light is internally reflected to produce a first lasing condition having a first reflection phase;
a reflective element positioned opposite the second at least partially-reflective facet of said gain medium, said first at least partially-reflected facet and reflective element defining an external laser cavity in which a second portion of light is internally reflected to produce a second lasing condition having a second reflection phase; and
means for adjusting the first reflection phase relative to the second reflection phase to control a characteristic of an optical output produced by the laser apparatus as a function of the first and second lasing conditions, said characteristic comprising at least one member from the group of: laser output power, side-mode suppression, stabilizing laser operations relative to external perturbations, and tuning the laser.

2. The apparatus of claim 1, wherein the means for adjusting the first reflection phase relative to the second reflection phase comprises a means for adjusting the temperature of the gain medium.

3. The apparatus of claim 2, wherein the means for adjusting the temperature of the gain medium comprises a temperature-controllable element thermally coupled to the gain medium.

4. The apparatus of claim 3, wherein the temperature-controllable element comprises a gain medium sled on which the gain medium sits.

5. The apparatus of claim 3, wherein the temperature-controllable element includes at least one heating element.

6. The apparatus of claim 3, wherein the temperature-controllable element includes at least one cooling element.

7. The apparatus of claim 3, further comprising a temperature controller operatively coupled to the temperature-controllable element to control the temperature of the temperature-controllable control component.

8. The apparatus of claim 7, wherein the temperature control means employs a temperature vs. channel/wavelength frequency lookup table to determine a target temperature of the gain medium corresponding to a selected channel/wavelength frequency.

9. The apparatus of claim 7, wherein the temperature control means employs a temperature vs. wavelength polynomial function from which a target temperature may be derived based on a channel/wavelength frequency input.

10. The apparatus of claim 1, further comprising a wavelength selection element optically coupled to the gain medium and positioned within said external laser cavity.

11. The apparatus of claim 10, wherein the wavelength selection element comprises an etalon.

12. The apparatus of claim 10, wherein the wavelength selection element comprises a pair of etalons disposed opposite one another in the external laser cavity.

13. The apparatus of claim 1, wherein the reflective element comprises a Littrow grating.

14. A tunable external cavity laser apparatus, comprising:
    a platform;
    a gain medium operatively coupled to the platform, said cain medium having a first reflective facet and a second substantially non-reflective facet defining a facet laser cavity in which a first portion of light emitted by the gain medium in response to an electrical input is internally reflected to produce a first lasing condition having a first reflection phase;
    a reflective element positioned opposite the second facet of said gain medium, said first facet and reflective element defining an external laser cavity in which a second portion of light is internally reflected to produce a second lasing condition having a second reflection phase;
    a temperature-controllable element, thermally coupled to the gain medium; and
    a temperature controller, operatively coupled to the temperature-controllable element, to adjust the first reflection phase by controlling the temperature of the gain medium to enable a phase angle corresponding to the difference between the first and second reflection phases to be adjusted.

15. The apparatus of claim 14, wherein the temperature-controllable element includes at least one heating element.

16. The apparatus of claim 14, wherein the temperature-controllable element includes at least one Peltier-effect cooling element.

17. The apparatus of claim 14, further comprising a temperature sensor operatively coupled to at least one of the gain media and temperature-controllable element.

18. The apparatus of claim 14, further comprising a wavelength selection element coupled to said platform and positioned within said external laser cavity.

19. The apparatus of claim 18, wherein the wavelength selection element is adjustable, further comprising a controller operatively coupled to the wavelength selection element, to control a wavelength of an optical beam output by the apparatus in response to a selected channel input.

20. The apparatus of claim 19, wherein the controller is further operatively coupled to the temperature controller and employs a temperature vs. channel/wavelength frequency lookup table to determine a target temperature of the gain medium corresponding to a selected channel and provides a corresponding temperature command to the temperature controller.

21. The apparatus of claim 19, wherein the controller is further operatively coupled to the temperature controller and employs a temperature vs. wavelength polynomial function from which a target temperature of the gain medium may be derived based on a select channel/frequency input, and further wherein the controller sends a command corresponding to the target temperature to the temperature controller.

22. The apparatus of claim 14, further comprising a servo controller operatively coupled to the apparatus to control a characteristic of an output beam produced by the apparatus.

23. The apparatus of claim 22, wherein the characteristic comprises a power output level of the output beam and the servo controller includes an optical power detector to detect the power level of the output beam.

24. The apparatus of claim 22, wherein the servo controller employs a Tau/dither control loop.

25. The apparatus of claim 23, further comprising a beam splitter to split a portion of the output beam off from which the optical power level of the output beam may be detected.

26. A method for operating a laser, comprising:
    providing an external cavity laser including:
        producing a first lasing condition in a gain medium having a first reflective facet and a second substantially non-reflective facet defining a facet laser cavity by internally reflecting a first portion of light emitted from the gain medium, said first lasing condition having a laser facet reflection phase;
        producing a second lasing by reflecting a second portion of light emitted by the gain medium in an external laser cavity defined by a reflective element positioned opposite the second facet of said gain medium and said first facet, said second lasing condition having an external laser cavity reflection phase; and
        controlling the laser facet reflection phase relative to the external laser cavity reflection phase to control a characteristic of an optical output produced by the laser apparatus as a function of the first and second lasing conditions, said characteristic comprising at least one member from the group of: laser output power, side-mode suppression, stabilizing laser operations relative to external perturbations, and tuning the laser.

27. The method of claim 26, wherein controlling the laser facet reflection phase relative to the external laser cavity reflection phase comprises adjusting the optical path length of the facet laser cavity.

28. The method of claim 27, wherein the optical path length of the facet laser cavity is adjusted by controlling the temperature of the gain medium.

29. The method of claim 28, wherein the temperature of the gain medium is controlled by controlling the temperature of a temperature-controllable element thermally coupled to the gain medium.

30. The method of claim 28, wherein the temperature of the gain medium is servoed in response to a feedback signal reflective of a characteristic of an output beam emitted from the laser.

* * * * *

UNITED STATES PATENT AND TRADEMARK OFFICE
CERTIFICATE OF CORRECTION

PATENT NO. : 6,724,790 B1
DATED : April 20, 2004
INVENTOR(S) : Daiber et al.

It is certified that error appears in the above-identified patent and that said Letters Patent is hereby corrected as shown below:

Column 10,
Line 25, delete ";" and insert -- , --.

Column 15,
Line 40, delete "cain" and insert -- gain --.

Signed and Sealed this

Tenth Day of August, 2004

JON W. DUDAS
*Acting Director of the United States Patent and Trademark Office*